United States Patent
Nakagawa (10) Patent No.: US 7,203,071 B2
(45) Date of Patent: Apr. 10, 2007

(54) COMPONENT MOUNTING CIRCUIT BOARD WITH RESIN-MOLDED SECTION COVERING CIRCUIT PATTERN AND INNER COMPONENTS

(75) Inventor: Tatsuya Nakagawa, Aichi (JP)

(73) Assignee: Kabushiki Kaisha Toshiba, Kanagawa (JP)

( * ) Notice: Subject to any disclaimer, the term of this patent is extended or adjusted under 35 U.S.C. 154(b) by 111 days.

(21) Appl. No.: 10/726,660

(22) Filed: Dec. 4, 2003

(65) Prior Publication Data

US 2004/0090753 A1    May 13, 2004

Related U.S. Application Data

(63) Continuation of application No. 09/654,412, filed on Sep. 1, 2000, now abandoned.

(30) Foreign Application Priority Data

Sep. 2, 1999    (JP)    ............... 11-248664

(51) Int. Cl.
    *H05K 5/00*    (2006.01)
    *H05K 7/00*    (2006.01)
(52) U.S. Cl. ............. 361/752; 361/728; 361/820
(58) Field of Classification Search ........... 361/775, 361/813, 760, 761, 728, 820, 764, 762, 774, 361/767, 771; 257/690, 691, 698; 174/250, 174/261, 262, 258, 51.2, 52.2, 52.3; 29/831, 29/846, 848, 849; 439/76.2
See application file for complete search history.

(56) References Cited

U.S. PATENT DOCUMENTS

| 3,898,535 | A | * | 8/1975 | Ebbert .................. 361/710 |
| 3,959,874 | A |   | 6/1976 | Coucoulas .................. 174/52.2 |
| 3,978,375 | A |   | 8/1976 | Fukui et al. .................. 317/101 |
| 4,314,126 | A |   | 2/1982 | Yoshimura et al. ...... 219/10.55 |
| 4,812,617 | A |   | 3/1989 | Takeuji et al. .......... 219/10.55 |
| 5,377,139 | A |   | 12/1994 | Lage et al. .................. 365/154 |
| 5,379,186 | A |   | 1/1995 | Gold et al. .................. 361/706 |
| 5,834,705 | A |   | 11/1998 | Jonaidi .................. 174/261 |
| 6,329,603 | B1 |  | 12/2001 | Japp et al. .................. 174/255 |

FOREIGN PATENT DOCUMENTS

| EP | 0 507 532 | 10/1992 |
| EP | 0 722 264 | 7/1996 |
| GB | 1 502 554 | 3/1978 |

* cited by examiner

*Primary Examiner*—Kamand Cuneo
*Assistant Examiner*—Thanh S. Phan
(74) *Attorney, Agent, or Firm*—Pillsbury Winthrop Shaw Pittman, LLP (57) ABSTRACT

A component mounting circuit board includes a circuit pattern including a plurality of electrically conductive plates, an inner electrical component electrically connected to the circuit pattern, and a resin molded section made of a resin by way of molding so as to cover the circuit pattern and the inner electrical component. The resin molded section has an opening allowing an outer electrical component located outside the resin molded section to be connected to the circuit pattern through it.

7 Claims, 7 Drawing Sheets

COMPONENT MOUNTING CIRCUIT BOARD WITH RESIN-MOLDED SECTION COVERING CIRCUIT PATTERN AND INNER COMPONENTS

This Application is a continuation of application Ser. No. 09/654,412, filed Sep. 1, 2000 now abandoned, the entire contents of which is hereby incorporated by reference.

BACKGROUND OF THE INVENTION

1. Field of the Invention

This invention relates to a component mounting circuit board on which various electrical components are mounted.

2. Description of the Prior Art

Microwave ovens have conventionally been incorporated with a component mounting circuit board on which a power supply circuit for driving a magnetron, a switching circuit, etc. are mounted. The component mounting circuit board comprises a printed circuit board on which a circuit pattern comprising a conductive pattern of copper foil and various electrical components (such as IGBTs and capacitors) soldered to the printed circuit board.

A large current flows through the circuit pattern in the above-described circuit board. Accordingly, the conductive pattern of copper foil constituting the circuit pattern needs to have a large width. This results in a large circuit pattern and accordingly a large-sized component mounting circuit board. Furthermore, a large number of soldered portions through which a large current flows are exposed on the surface of the printed circuit board. There is yet room for improvement in the reliability of the circuit board.

SUMMARY OF THE INVENTION

Therefore, an object of the present invention is to provide a component mounting circuit board which has a small size and yet a high reliability and a method of making such a component mounting circuit board.

The present invention provides a component mounting circuit board comprising a circuit pattern including a plurality of electrically conductive plates, an inner electrical component electrically connected to the circuit pattern, and a resin molded section made of a resin by way of molding so as to cover the circuit pattern and the inner electrical component, the resin molded section having an opening allowing an outer electrical component located outside the resin molded section to be connected to the circuit pattern therethrough.

According to the above-described construction, the conductive plates each having a smaller width than the copper foil can be used when a large current is caused to flow through the conductive plates. Accordingly, since the circuit pattern is rendered smaller, the size of the component mounting circuit board can be reduced. Furthermore, since the inner electrical component is covered with the resin together with the circuit pattern, a connection therebetween is also covered with the resin. Moreover, since the outer electrical component is connected to the circuit pattern in the opening of the resin molded section, the connection therebetween can be prevented from projecting outside the resin molded section. Consequently, the reliability can be improved as compared with the conventional construction.

The resin molded section is preferably made of an epoxy resin. Further, the circuit pattern preferably includes a portion corresponding to the inner electrical component and provided with a thicker portion thicker than a remaining portion. Additionally, the circuit pattern preferably includes a portion corresponding to the inner electrical component and provided with an exposed portion exposed outside the resin molded section.

The component mounting circuit board preferably further comprises a metal member embedded in the resin molded section so as to be located to correspond to a portion of the inner electrical component and electrically insulated from the circuit pattern, the metal member being provided with an exposed portion exposed outside the resin molded section. Further, the component mounting circuit board preferably further comprises a metal member embedded in the resin molded section so as to be located at a portion corresponding to the inner electrical component, the metal member being discrete from the circuit pattern.

The component mounting circuit board preferably further comprises a support provided on the resin molded section to support the outer electrical component. Further, the component mounting circuit board further comprises a terminal provided on the circuit pattern so as to project outside the resin molded section. The inner electrical component is preferably connected to the circuit pattern by wire bonding. The outer electrical component is soldered to a portion of the circuit pattern corresponding to the opening.

BRIEF DESCRIPTION OF THE DRAWINGS

Other objects, features and advantages of the present invention will become clear upon reviewing of the following description of the preferred embodiments, made with reference to the accompanying drawings, in which.

DETAILED DESCRIPTION OF THE PREFERRED EMBODIMENTS

Figure 1:
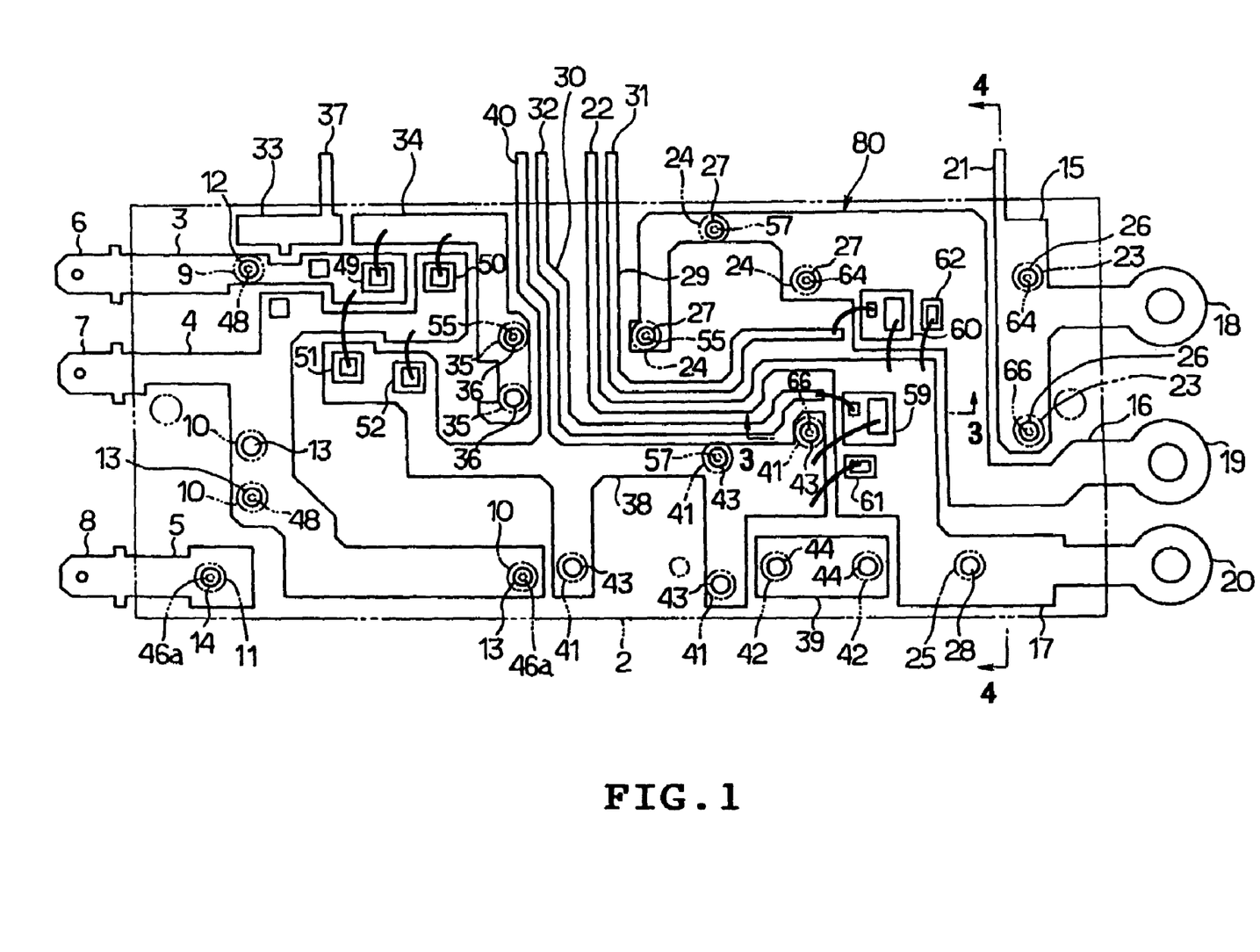
FIG. 1 is a plan view of a plan view of the component mounting circuit board of a first embodiment in accordance with the present invention.
Figure 2:
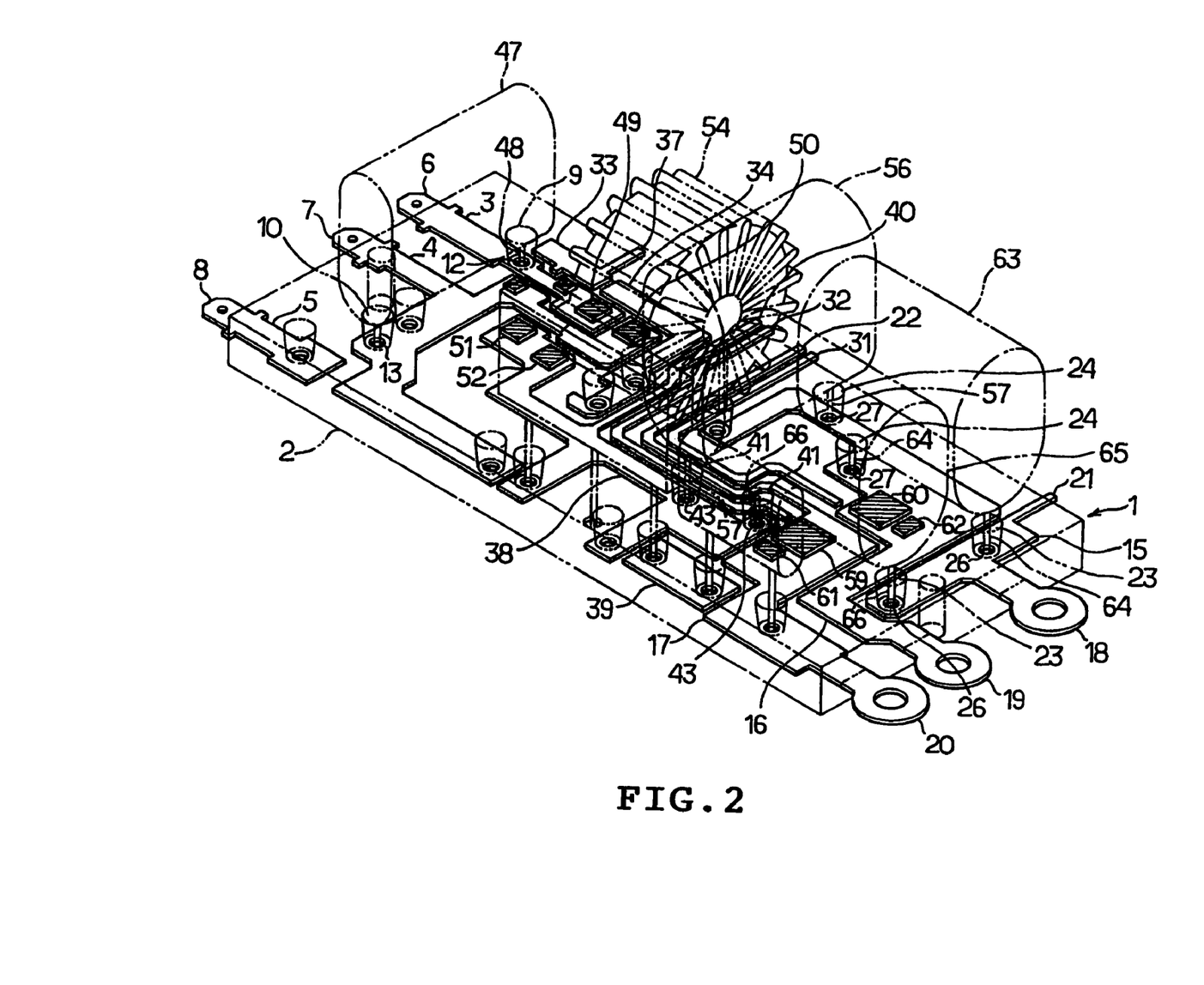
FIG. 2 is a perspective view of the circuit board.

A first embodiment of the present invention will be described with reference to FIGS. 1 to 5. In the first embodiment, the component mounting circuit board 1 as shown in FIG. 2 is incorporated in a machine compartment defined in a cabinet of a microwave oven (not shown). The component mounting circuit board 1 comprises a resin molded section 2 made of, for example, an epoxy resin into the shape of a rectangular plate long sideways. Three input copper plates 3, 4 and 5 serving as respective electrically conductive plates are provided in a left portion of the resin molded section 2 as viewed in FIG. 1. The copper plates 3 to 5 have respective left ends projecting out of the left side face of the resin molded section 2. The projecting portions of the copper plates 3 to 5 constitute terminals 6, 7 and 8 respectively.

The resin molded section 2 has one opening 9 corresponding to the input copper plate 3, three openings 10 corresponding to the input copper plate 4, and one opening 11 corresponding to the input copper plate 5. These openings 9 to 11 are circular and extend through the resin molded section 2 in the direction of the thickness thereof. The input copper plate 3 has a terminal hole 12 formed to correspond to the opening 9 of the resin molded section 2. The input copper plate 4 has three terminal holes 13 formed to correspond to the openings of the resin molded section 2 respectively. The input copper plate 5 has a terminal hole 14 formed to correspond to the opening 11 of the resin molded section 2.

Three output copper plates 15, 16 and 17 serving as conductive plates are embedded in the right portion of the resin molded section 2 except respective right ends thereof which project out of the right side face of the resin molded section. The projecting portions of the copper plates 15 to 17 include integrally formed annular portions respectively. The projecting portions constitute terminals 18, 19 and 20 respectively. Further, the output copper plates 15 and 17 have narrow terminals 21 and 22 integrally projecting the plates respectively. The terminals 21 and 22 project out of an upper end face of the resin molded section 2.

The resin molded section 2 has two openings 23 both corresponding to the output copper plate 15, three openings 24 all corresponding to the output copper plate 16, and one opening 25 corresponding to the output copper plate 17. These openings 23 to 25 are circular and extend through the resin molded section 2 in the direction of the thickness thereof. The output copper plate 15 has two terminal holes 26 individually formed to correspond to the openings 23 of the resin molded section 2 respectively. The output copper plate 16 has three terminal holes 27 individually formed to correspond to the openings 24 of the resin molded section 2 respectively. The output copper plate 17 has one terminal hole 28 formed to correspond to the opening 25 of the resin molded section 2. Two narrow control copper plates 29 and 30 serving as conductive plates are embedded in the lengthwise middle portion of the resin molded section 2 except respective upper ends projecting out of the upper end face of the resin molded section. The projecting portions constitute terminals 31 and 32 respectively.

Four relay copper plates 33, 34, 38 and 39 serving as conductive plates are further embedded in the resin molded section 2. The resin molded section 2 has two openings 35 both formed to correspond to the relay copper plate 34. These openings 35 are circular and extends through the resin molded section 2 in the direction of the thickness thereof. The relay copper plate 34 has two terminal holes 36 both formed to correspond to the openings 35 of the resin molded section 2 respectively. The relay copper plate 33 has a right end with an integrally formed narrow terminal 37 projecting out of the upper end face of the resin molded section 2.

The relay copper plate 38 has an integrally formed narrow terminal 40 projecting out of the upper end face of the resin molded section 2. The resin molded section 2 has four openings 41 all formed to correspond to the relay copper plate 38 and two openings 42 both formed to correspond to the relay copper plate 39 as shown in FIGS. 1 and 2. These openings 41 and 42 are circular and extend through the resin molded section 2 in the direction of the thickness thereof. The relay copper plate 38 has four terminal holes 43 individually formed to correspond to the openings 41 of the resin molded section 2 respectively. The relay copper plate 39 has two terminal holes 44 individually formed to correspond to the openings 42 of the resin molded section 2 respectively.

The aforesaid conductive plates, namely, the input copper plates 3 to 5, the output copper plates 15 to 17, the control copper plates 29 and 30, the relay copper plates 33 and 34, and the relay copper plates 38 and 39 are formed, for example, by pressing a copper plate. Each conductive plate may be formed of any conductive metal plate other than the copper plate, for example, an aluminum plate or bronze plate. Further, as shown in FIG. 1, a circuit pattern 80 is composed of the input copper plates 3 to 5, output copper plates 15 to 17, control copper plates 29 and 30, relay copper plates 33 and 34, and relay copper plates 38 and 39.

Figure 5:
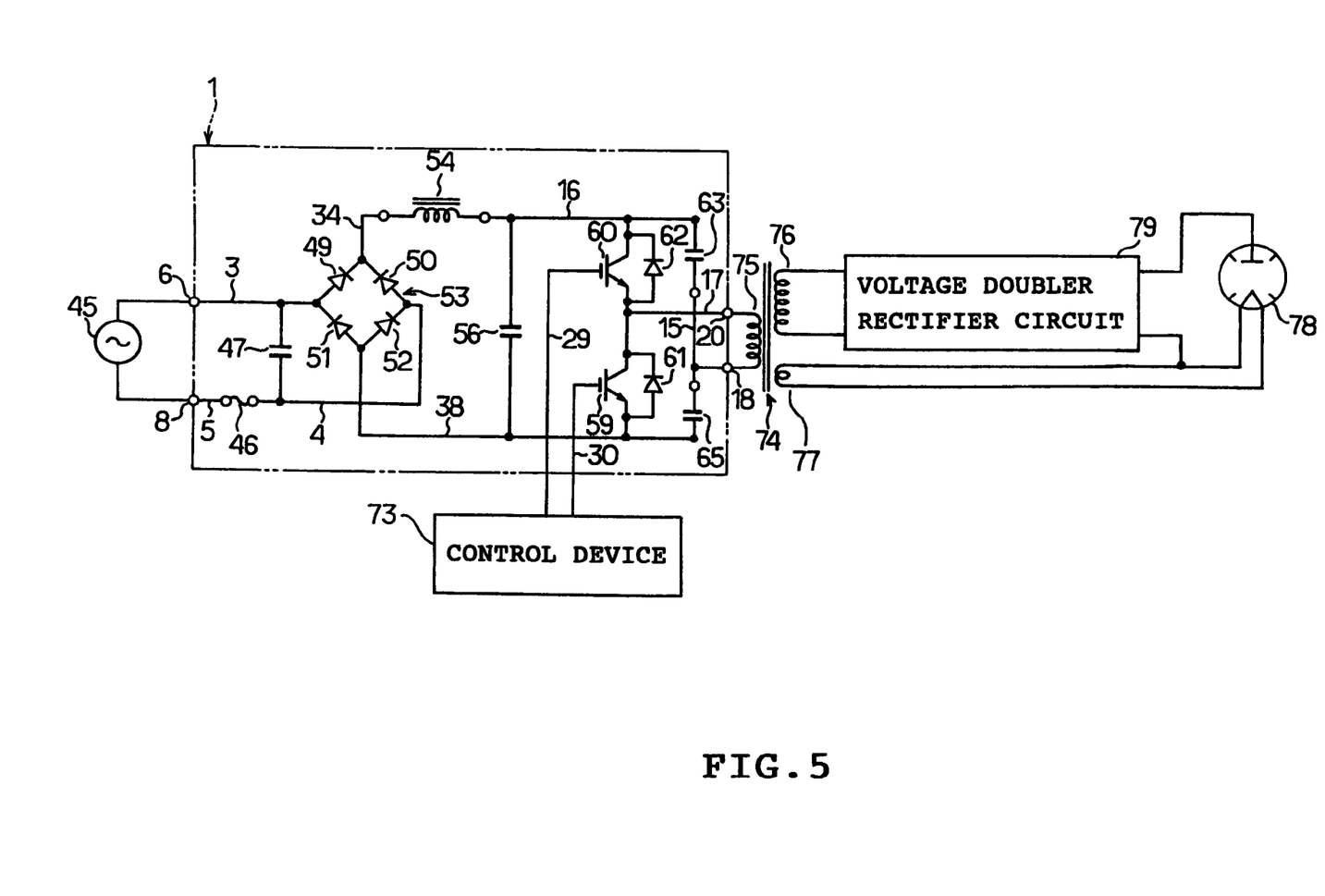
FIG. 5 is an electrical circuit diagram.

Two connectors (not shown) are connected to the terminal 6 of the input copper plate 3 and the terminal 8 of the input copper plate 5 respectively. These connectors have built-in terminals (not shown) holding the terminals 6 and 8 respectively. The aforesaid connectors are further connected to a commercial power supply (not shown) so that the terminals 6 and 8 of the input copper plates 3 and 5 are connected to the commercial power supply 45 as shown in FIG. 5. Further, a thermal fuse 46 serving as an outer electrical component is connected between the input copper plates 4 and 5. The thermal fuse 46 includes two lead terminals 46a as shown in FIG. 1. One of the lead terminals 46a is inserted through the opening 10 of the resin molded section 2 into the terminal hole 13 of the input copper plate 4. The other lead terminal 46a is inserted through the opening 11 of the resin molded section 2 into the terminal hole 14 of the input copper plate 5. Both lead terminals 46a are soldered to circumferential edges of the terminal holes 13 and 14 so that the thermal fuse 46 is connected between the input copper plates 4 and 5. Further, an anti-noise capacitor 47 serving as an outer electrical component is connected between the input copper plates 3 and 4 as shown in FIG. 5. The anti-noise capacitor 47 includes two lead terminals 48 as shown in FIG. 1. One of the lead terminals 48 is inserted through the opening 9 of the resin molded section 2 into the terminal hole 12 of the input copper plate 3. The other lead terminal 48 is inserted through the opening 10 of the resin molded section 2 into the terminal hole 13 of the left lower corner of the input copper plate 4. Both lead terminals 48 are soldered to the circumferential edges of the terminal holes 12 and 13 so that the anti-noise capacitor 47 is connected between the input copper plates 3 and 4.

Two chip diodes 49 and 50 both serving as inner electrical components are soldered to the right ends of the input copper plates 3 and 4 respectively as shown in FIG. 1. The chip diodes 49 and 50 are embedded in the resin molded section 2 so as to be sealed. Each of the chip diodes 49 and 50 has an underside on which an anode pad (not shown) is provided and a top on which a cathode pad (see FIG. 1) is provided. As the result of the aforesaid soldering, the anodes of the chip diodes 49 and 50 are connected to the input copper plates 3 and 4 respectively. The cathodes of the chip diodes 49 and 50 are connected to the relay copper plates 34 by means of wire bonding. Further, two chip diodes 51 and 52 both serving as inner electrical components are soldered to the left end of the relay copper plate 38 as shown in FIG. 1. The chip diodes 51 and 52 are embedded in the resin molded section 2 so as to be sealed. Each chip diode 51, 52 has an underside on which an anode pad (not shown) is provided and a top on which a cathode pad (see FIG. 1) is provided. As the result of the aforesaid soldering, the anodes of the chip diodes 51 and 52 are connected to the relay copper plate 38. The cathodes of the chip diodes 51 and 52 are connected to the input copper plates 3 and 4 by means of wire bonding respectively. The aforesaid four chip diodes 49 to 52 constitute a rectifier circuit 53 as shown in FIG. 5.

A choke coil 54 serving as an outer electrical component is connected between the relay copper plate 34 and the output copper plate 16 as shown in FIG. 5. The choke coil 54 has two lead terminals 55 as shown in FIG. 1. One of the lead terminals 55 is inserted through the opening 35 of the resin molded section 2 into the terminal hole 36 of the relay copper plate 34. The other lead terminal 55 is inserted through the opening 24 of the resin molded section 2 into the terminal hole 27 of the output copper plate 16. Both lead terminals 55 are soldered to the circumferential edges of the terminal holes 36 and 37 respectively so that the choke coil 54 is connected between the relay copper plate 34 and the output copper plate 16. Further, a smoothing capacitor 56 serving as an outer electrical component is connected between the output copper plate 16 and the relay copper plate 38 as shown in FIG. 5. The smoothing capacitor 56 has two lead terminals 57 as shown in FIG. 1. One of the lead terminals 57 is inserted through the opening 24 of the resin molded section 2 into the terminal hole 27 of the output copper plate 16. The other lead terminal 57 is inserted through the opening 41 of the resin molded section 2 into the terminal hole 43 of the relay copper plate 38. Both lead terminals 57 are soldered to the circumferential edges of the terminal holes 27 and 43 respectively so that the smoothing capacitor 56 is connected between the output copper plate 16 and the relay copper plate 38.

Figure 3:
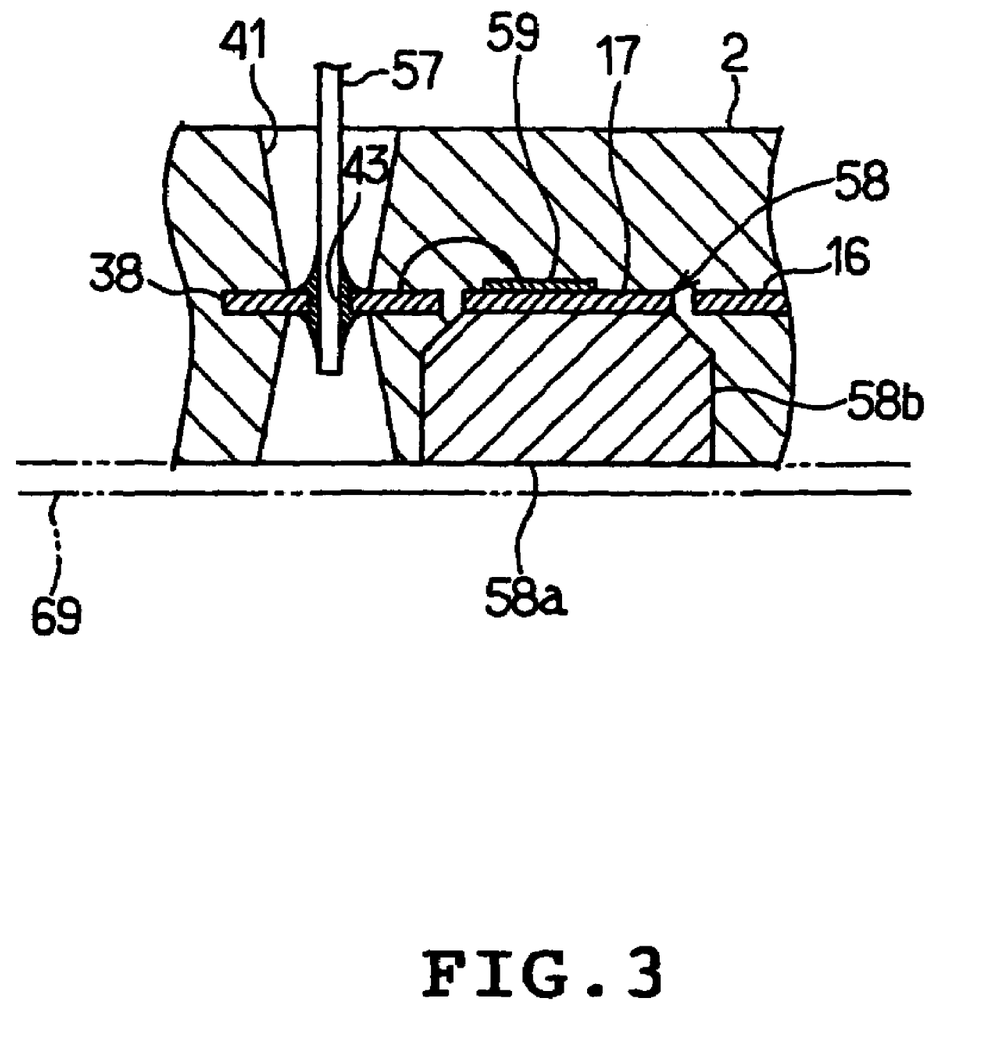
FIG. 3 is a sectional view taken along line 3—3 in FIG. 1.

The output copper plate 17 includes a thicker portion 58 thicker than the other portion thereof as shown in FIG. 3. The thicker portion 58 is formed by soldering or welding a metal member 58b made of copper or aluminum to the underside of the output copper plate 17. The thicker portion 58 has an underside exposed out of the underside of the resin molded section 2, whereupon the underside of the thicker portion 58 serves as an exposed portion 58a. An inner electrical component or insulated-gate bipolar transistor (IGBT) 59 is soldered to the upper face of the output copper plate 17 so as to correspond to the thicker portion 58 of the plate. The IGBT 59 comprises a semiconductor bare chip and is embedded in the resin molded section 2 so as to be sealed. The IGBT 59 has an underside on which a collector pad (not shown) is provided. The collector is connected to the output copper plate 17 by means of soldering. The IGBT 59 further has a top on which pads of the gate and emitter are provided as shown in FIG. 1. The gate is connected to the control copper plate 30 by means of wire bonding, whereas the emitter is connected to the relay copper plate 38 by means of wire bonding.

An inner electrical component or IGBT 60 is soldered to the upper face of the output copper plate 16. The underside of the output copper plate 16 includes a portion corresponding to the IGBT 60 and provided with a thicker portion which is substantially the same as the thicker portion 58. The IGBT 60 comprises a semiconductor bare chip and is embedded in the resin molded section 2 so as to be sealed. The IGBT 60 has an underside on which a collector pad (not shown) is provided. The collector is connected to the output copper plate 16 by means of soldering. The IGBT 60 further has a top on which pads of the gate and emitter are provided as shown in FIG. 1. The gate is connected to the control copper plate 29 by means of wire bonding, whereas the emitter is connected to the output copper plate 17 by means of wire bonding.

A chip diode 61 serving as an inner electrical component is soldered to the top of the output copper plate 17 so as to be located below the IGBT 59. The chip diode 61 is embedded in the resin molded section 2. The chip diode 61 has an underside on which an anode pad (not shown) is provided and a top on which a cathode pad (see FIG. 1) is provided. As the result of the aforesaid soldering, the anode of the chip diode 61 is connected to the output copper plate 17 (the collector of the IGBT 59). The cathode of the chip diode 61 is connected to the relay copper plates 38 (the emitter of the IGBT 59) by means of wire bonding. Consequently, the chip diode 61 is connected between the collector and emitter of the IGBT 59 in the polarity as shown in FIG. 5. Further, a chip diode 62 serving as an inner electrical component is soldered to the top of the output copper plate 16 so as to be located on the right of the IGBT 60. The chip diode 62 is embedded in the resin molded section 2. The chip diode 62 has an underside on which an anode pad (not shown) is provided and a top on which a cathode pad (see FIG. 1) is provided. As the result of the aforesaid soldering, the anode of the chip diode 62 is connected to the output copper plate 16 (the collector of the IGBT 60). The cathode of the chip diode 62 is connected to the output copper plate 17 (the emitter of the IGBT 60) by means of wire bonding. Consequently, the chip diode 62 is connected between the collector and emitter of the IGBT 60 in the polarity as shown in FIG. 5.

A resonance capacitor 63 serving as an outer electrical component is connected between the output copper plates 15 and 16 as shown in FIG. 5. The resonance capacitor 63 includes two lead terminals 64 as shown in FIG. 1. One of the lead terminals 64 is inserted through the opening 23 of the resin molded section 2 into the terminal hole 26 of the output copper plate 15. The other lead terminal 64 is inserted through the opening 24 of the resin molded section 2 into the terminal hole 27 of the output copper plate 16. Both lead terminals 64 are soldered to the circumferential edges of the terminal holes 26 and 27 respectively so that the resonance capacitor 63 is connected between the output copper plates 15 and 16. Further, a resonance capacitor 65 serving as an outer electrical component is connected between the output copper plate 15 and the relay copper plate 38 as shown in FIG. 5. The resonance capacitor 65 includes two lead terminals 66 as shown in FIG. 1. One of the lead terminals 66 is inserted through the opening 23 of the resin molded section 2 into the terminal hole 26 of the output copper plate 15. The other lead terminal 66 is inserted through the opening 41 of the resin molded section 2 into the terminal hole 43 of the relay copper plate 38. Both lead terminals 66 are soldered to the circumferential edges of the terminal holes 26 and 43 so that the resonance capacitor 65 is connected between the output copper plate 15 and the relay copper plate 38.

Figure 4:
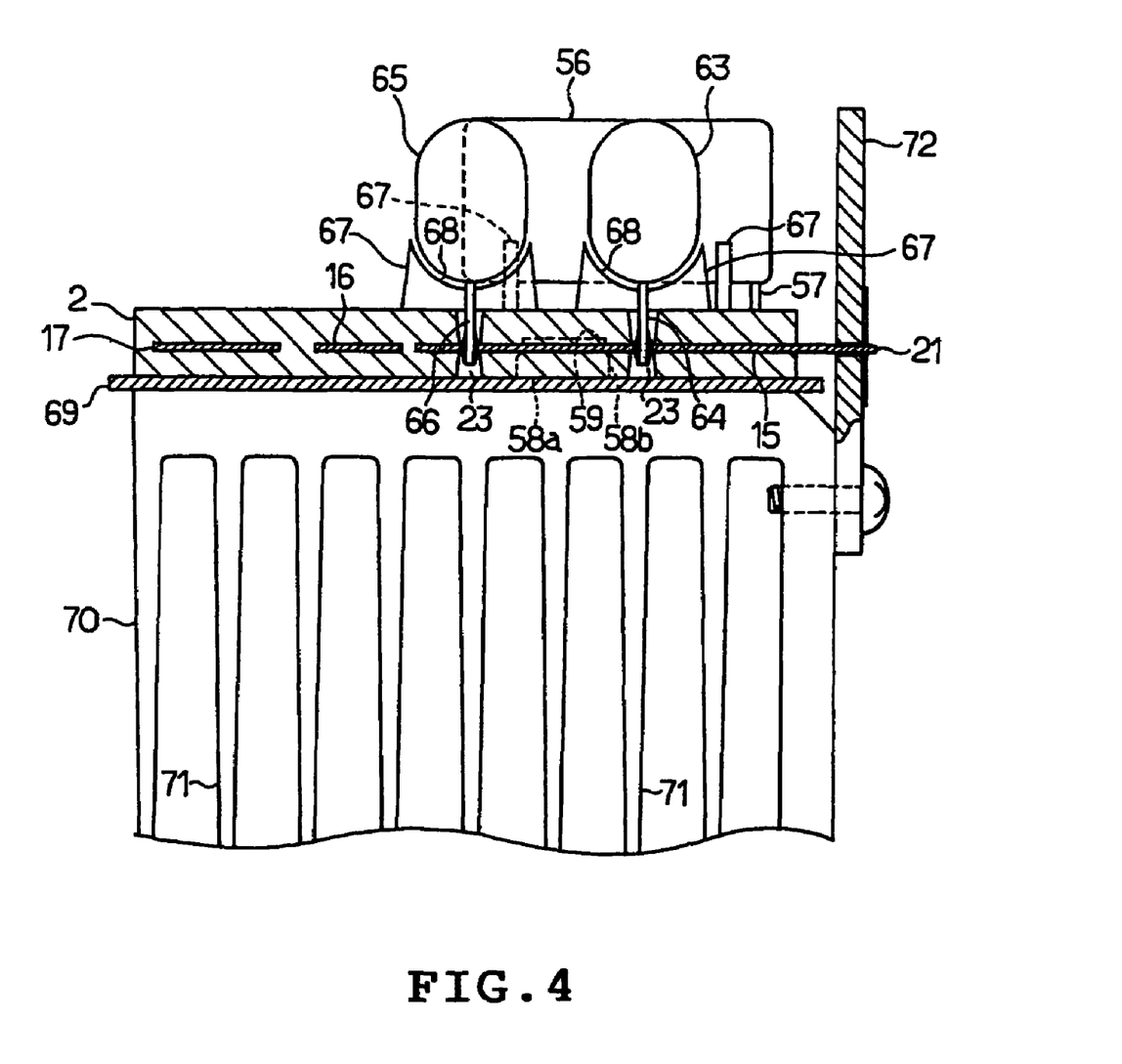
FIG. 4 is a sectional view taken along line 4—4 in FIG. 1.

The resin molded section 2 has flat plate-shaped ribs 67 integrally formed thereon so as to be located at both ends of the smoothing capacitor 56 and resonance capacitors 63 and 65 respectively as shown in FIG. 4. The ribs 67 located at both ends of the smoothing capacitor 56 are shown. Regarding the resonance capacitors 63 and 65, however, only the ribs 67 located at respective one ends are shown. Each rib 67 has a generally arc-shaped recess 68 corresponding to a contour of the related capacitor. Each capacitor is fitted in the recess 68 to be supported so as to be prevented from falling. Each rib 67 serves as a support. The resin molded section 2 also includes portions corresponding to both ends of the anti-noise capacitor 47 respectively. Substantially the same ribs (not shown) as those 67 are formed integrally on these portions of the resin molded section 2.

A radiating panel 70 is screwed to a flat shaped insulator 69 further fixed to the underside of the resin molded section 2. As a result, the exposed portions 58a of the thicker portions 58 of the output copper plates 16 and 17 are closely adherent to the insulator 69 as shown in FIG. 3. Only the thicker portion 58 of the output plate 17 is shown. The radiating panel 70 is made of a metal with a high heat conductivity, for example, aluminum. The radiating panel 70 has a plurality of radiating fins 71 as shown in FIG. 4. The insulator 69 is made of an insulating material with a high heat conductivity, for example, a material made by mixing to silicon rubber powder of alumina ceramics or aluminum nitride.

A control circuit board 72 comprising a printed circuit board is screwed to the radiating panel 70 as shown in FIG. 4. Circuit board terminals 21 and 22 of the output copper plates 15 and 17, circuit board terminals 31 and 32 of the control copper plates 29, and circuit board terminals 37 and 40 of the relay copper plates 33 and 38 are all inserted into the control circuit board 72 and soldered to a circuit pattern made of a copper foil and provided on the control circuit board 72. Further, a control device 73 is mounted on the control circuit board 72 as shown in FIG. 5. The control device 73 mainly comprises a microcomputer and has a function of controlling the overall operation of the microwave oven. The control device 73 delivers drive signals to the gates of the IGBTs 59 and 60 to thereby control the switching of the IGBTs 59 and 60.

A step-up transformer 74 as shown in FIG. 5 includes a primary coil 75, a secondary coil 76 and a heater coil 77. The primary coil 75 has both ends connected to the terminal 18 of the output copper plate 15 and the terminal 20 of the output copper plate 17 respectively. In this case, both ends of the primary coil 75 are provided with annular terminals (not shown) having the same shape as the terminals 18 and 20, respectively. The annular terminals are screwed to the terminals 18 and 20 of the output copper plates 15 and 17 respectively. Further, the heater coil 77 has both ends connected to the cathode terminals of a magnetron 78. The secondary coil 76 has both ends connected to input terminals of a voltage doubler rectifier circuit 79. One of two output terminals of the voltage doubler rectifier circuit 79 is connected to an anode terminal of the magnetron 78. The other output terminal of the voltage doubler rectifier circuit 79 is connected to a cathode terminal of the magnetron 78.

A method of manufacturing the aforesaid component mounting circuit board 1 will now be described. The chip diodes 49 and 50 are placed on and soldered to the input copper plates 3 and 4 respectively. The chip diodes 51 and 52 are placed on and soldered to the relay copper plate 38. The IGBT 59 and chip diode 61 are placed on and soldered to the output copper plate 17. The IGBT 60 and chip diode 62 are placed on and soldered to the output copper plate 16. The chip diodes 49 to 52, 61 and 62, and the IGBTs 59 and 60 are then connected to predetermined copper plates by means of wire bonding.

Thereafter, the input copper plates 3 to 5, output copper plates 15 to 17, control copper plates 29 and 30, and relay copper plates 33, 34, 38 and 39 are put into the molding die (not shown). The molding die includes an upper die and a lower die. A molten epoxy resin is then poured into the molding die so that the resin molded section 2 is molded. The molding die is subsequently opened and the resin molded section 2 is taken out of the molding die. Thereafter, the thermal fuse 46, anti-noise capacitor 47, choke coil 54, smoothing capacitor 56, and resonance capacitors 63 and 65 are soldered to the copper plates of the resin molded section 2. Thus, the component mounting circuit board 1 is manufactured.

According to the above-described embodiment, the circuit pattern 80 is composed of electrically conductive plates including the input copper plates 3 to 5, output copper plates 15 to 17, control copper plates 29 and 30, and relay copper plates 33, 34, 38 and 39. Accordingly, since the conductive plates each of which has a smaller width than the conductor pattern of copper foil are allowed to be used, the circuit pattern can be rendered small. Further, since the inner electrical components such as the IGBT 59 are embedded in the resin molded section 2 to be sealed, the portion of each inner electrical component connected to the circuit pattern 80 is sealed by the resin molded section 2. Further, the outer electrical components such as the resonance capacitor 63 are soldered and connected to the copper plates etc. within the openings 23. Accordingly, the portions of the outer electrical components connected to the circuit pattern 80 are prevented from projecting out of the resin molded section 2. Consequently, the reliability can be improved in the above-described construction as compared with the prior art. Additionally, since the resin molded section 2 is made from the epoxy resin, the insulation performance, heat resistance and moldability of the resin molded section 2 can be improved.

The output copper plates 16 and 17 include the thicker portions 58 on which the IGBTs 60 and 59 are mounted, respectively. Each thicker portion 58 includes the exposed portion 58a caused to come into contact with the corresponding insulator 69. In the aforesaid arrangement, heat generated by each of the IGBTs 59 and 60 is radiated through the corresponding exposed portion 58a directly out of the resin molded section 2. Consequently, the heat-radiating performance of each IGBT can be improved and accordingly, the size of the radiating panel 70 can be reduced.

Thinner portions may be provided on the portions of the resin molded section 2 corresponding to the thicker portions 58, instead of the exposed portions 58a provided on the thicker portions 58 respectively. In this case, too, the radiation resistance is rendered smaller in the thinner portions of the resin molded section 2 than in the other portion thereof. Consequently, the heat-radiating performance of each IGBT can be improved. Furthermore, the thicker portions 58a are formed by joining the discrete metal plates 58b with the output copper plates 17 and 16 respectively. Consequently, the thicker portions 58a can be formed more easily as compared with a case where thicker and thinner portions are formed on the output copper plates 17 and 16 only by pressing the conductive plate.

The ribs 67 are provided on the resin molded section 2 for supporting the outer electrical components such as the smoothing capacitor 56. Consequently, since the outer electrical components are soldered to the copper plates of the circuit pattern 80 while being supported by the ribs 67, the working efficiency in connecting the outer electrical components to the circuit pattern 80 can be improved.

The input copper plates 3 to 5 of the circuit pattern 80 include the projection-like terminals 6 to 8 with which connectors are fitted to be connected, respectively. Consequently, the commercial AC power supply can easily be connected to each of the input copper plates 3 to 5. Further, the output copper plates 15 to 17 of the circuit pattern 80 include the projection-like terminals 18 to 20 with the annular portions respectively. The other terminals having substantially the same shape as the terminals 18 to 20 are screwed and connected to the latter terminals respectively. Consequently, the primary coil 75 of the step-up transformer 74 can easily be connected to the output copper plates 15 to 17 of the circuit pattern 80. Additionally, the copper plates of the circuit pattern 80 are provided with the respective elongate projection-like terminals 21, 22, 31, 32, 37 and 40 inserted into the control circuit board 72 to be soldered to the circuit pattern. As a result, the circuit pattern 80 can easily be connected to the control circuit board 72.

Figure 6:
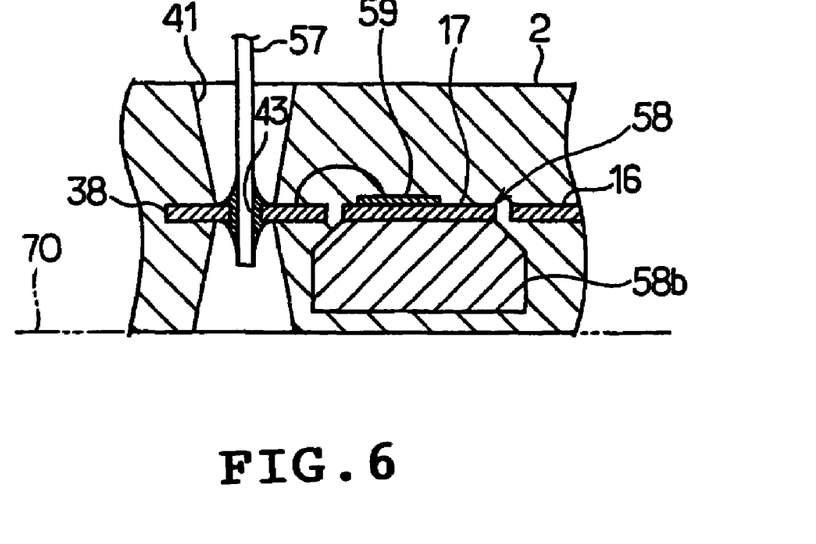
FIG. 6 is a view similar to FIG. 3, showing the component mounting circuit board of a second embodiment in accordance with the present invention.

The exposed portion 58a is provided on the underside of the thicker portion 58 in the foregoing embodiment. However, the underside of the thicker portion 58 may be embedded in the resin molded section 2 as shown as a second embodiment in FIG. 6, instead. Since a lower portion of the thicker portion 58 has a reduced thickness, the radiation resistance is rendered smaller in the thinner portion of the resin molded section 2 than in the other portion thereof. Consequently, the heat-radiating performances of the IGBTs 59 and 60 can be improved. Further, since the radiating panel 70 is mounted on the resin molded section 2 so as to be in direct contact with the underside of the section, the insulator 69 need not be provided.

Figure 7:
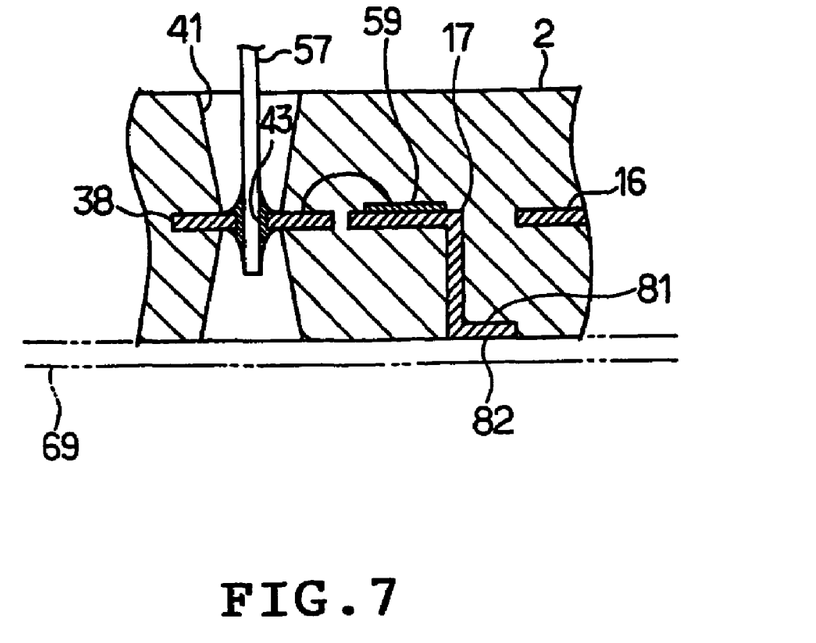
FIG. 7 is a view similar to FIG. 3, showing the component mounting circuit board of a third embodiment in accordance with the present invention.

The metal members 58b are joined to the undersides of the output copper plates 16 and 17 respectively so that the thicker portion 58 is provided, in the first and second embodiments. For example, however, a thick plate may be pressed except for the thicker portion 58 so that the other thinner portion is formed, instead. Further, the thicker portions 58 are provided on the output copper plates 16 and 17, and the exposed portions 58a are provided on the undersides of the thicker portions 58, respectively, in the first embodiment. However, the output copper plates 16 and 17 may have bent portions 81 respectively as shown as a third embodiment in FIG. 7 which shows only the bent portion 81 of the copper plate 17. In this construction, the underside of each bent portion 81 is exposed outside the resin molded section 2 so as to serve as the exposed portion 82. Consequently, since the thick metal members 58a are not required, the number of components can be reduced and the weight of the product can be reduced.

Figure 8:
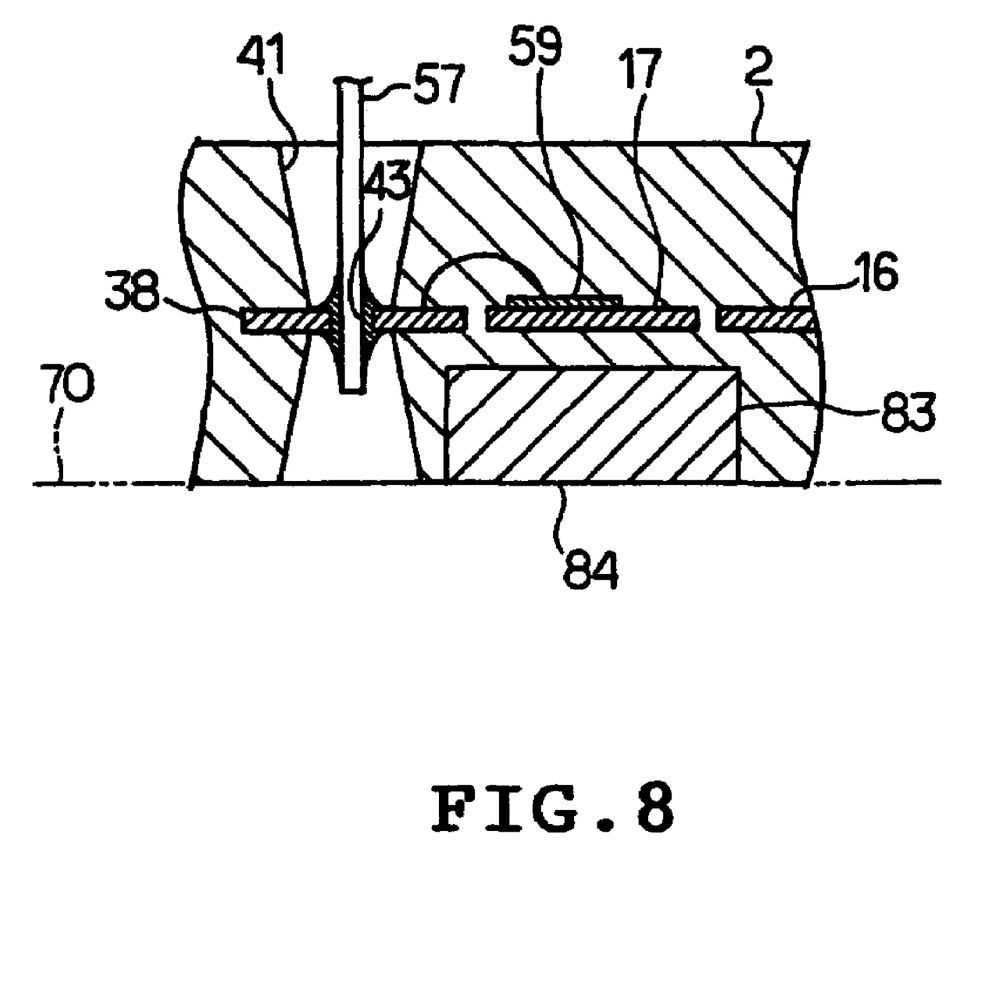
FIG. 8 is a view similar to FIG. 3, showing the component mounting circuit board of a fourth embodiment in accordance with the present invention.

FIG. 8 illustrates a fourth embodiment of the invention. In the fourth embodiment, two plate-shaped metal members 83 are embedded in the resin molded section 2 so as to be located below the IGBTs 59 and 60 respectively. FIG. 8 shows only the metal member 83 embedded below the IGBT 59. The metal members 83 are provided by molding together with the conductive plates 3 to 5 etc. The underside of each metal member 83 is exposed outside the resin molded section 2, so as to serve as an exposed portion 84. The radiating panel 70 is attached to the underside of the resin molded section 2 to be fixed thereto. The exposed portion 84 of each metal member 83 has an underside directly adherent closely to the radiating panel 70.

According to the fourth embodiment, the metal members 83 discrete from the copper plates of the circuit pattern 80 are embedded in the resin molded section 2. The resin molded section 2 includes portions located between the metal members 83 and the IGBTs 59 and 60 respectively. These portions are thinned. Accordingly, since the radiation resistance is rendered smaller in the thinner portions of the resin molded section 2 than in the other portion thereof. Consequently, the heat-radiating performances of the IGBTs 59 and 60 can be improved.

Further, the metal members 83 are insulated from the copper plates of the circuit patter 80 and provided with the respective exposed portions in the fourth embodiment. The radiating panel 70 is directly attached to the resin molded section 2 without the insulator 69 being interposed therebetween. Consequently, since the insulator 69 is unnecessary, the number of components can be reduced.

In a modified form, a solder paste may be applied via the opening 9 of the resin molded section 2 to the upper face of the input copper plate 3. The lead terminal 48 may then be pushed via the opening 9 against the applied solder paste to be soldered to the input copper plate 3 for connection. The other lead terminals may also be connected in the same manner. In this case, the terminal insertion hole 12 etc. need not be formed in the input copper plate 3 etc.

Further, the resin molded section 2 is formed with the through-hole-like opening 9 etc. in the foregoing embodiments. For example, however, the resin molded section 2 may have a recess-like opening which is open to the upper face of the input copper plate 3 only at the side where the lead terminals of outer electrical components are inserted, instead.

The input copper plates 3 to 5, output copper plates 15 to 17, control copper plates 29 and 30, and relay copper plates 33 and 44 are all made by pressing a copper plate in the foregoing embodiments. However, the copper plate may be etched, instead. Further, the invention is applied to the component mounting circuit board 1 on which the driving circuit for the magnetron 78 of the microwave oven is mounted. For example, however, the invention may be applied to a component mounting circuit board on which a driving circuit for a heating coil of a high-frequency heating apparatus is mounted or for a main motor of a washing machine, instead.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

I claim:

1. A component mounting circuit board comprising:
  a circuit pattern including a plurality of electrically conductive plates;
  an inner electrical component electrically connected to the circuit pattern; and
  a resin molded section made of a resin by way of molding so as to cover the circuit pattern and the inner electrical component, the resin molded section having an opening allowing an outer electrical component located outside the resin molded section to be connected to the circuit pattern therethrough after formation of the resin molded section, so that the inner and outer electrical components are interconnectable to each other via the circuit pattern;
  wherein the inner electrical component includes a rectifier circuit having input terminals and output terminals and an active element connected between the output terminals of the rectifier circuit and controlled so as to be switched;
  wherein the outer electrical component includes a resonance capacitor connected between the output terminals of the rectifier circuit; and
  wherein the circuit pattern includes as the electrically conductive plates:
    a plurality of input copper plates supplying AC power to one of input terminals and formed with terminals extending through a first side of the resin molded section and connected to an AC power supply outside the resin molded section;

a plurality of input copper plates supplying AC power to the other of the input terminals and formed with terminals extending through the first side of the resin molded section and connected to the AC power supply outside the resin molded section, and a plurality of output copper plates adapted to connect the active element or the resonance capacitor to a primary coil of an external step-up transformer and formed with terminals extending through a second side of the resin molded section opposed to the first side and connected to the primary coil of the step-up transformer outside the resin molded section.

2. The component mounting circuit board according to claim 1, wherein the resin molded section is made of an epoxy resin.

3. The component mounting circuit board according to claim 1, wherein the circuit pattern includes a portion corresponding to the inner electrical component and provided with a thicker portion thicker than a remaining portion.

4. The component mounting circuit board according to claim 1, wherein the circuit pattern includes a portion corresponding to the inner electrical component and provided with an exposed portion exposed outside the resin molded section.

5. The component mounting circuit board according to claim 1, further comprising a metal member embedded in the resin molded section so as to be located to correspond to a portion of the inner electrical component and electrically insulated from the circuit pattern, the metal member being provided with an exposed portion exposed outside the resin molded section.

6. The component mounting circuit board according to claim 1, further comprising a metal member embedded in the resin molded section so as to be located to correspond to a portion of the inner electrical component, the metal member being discrete from the circuit pattern.

7. The component mounting circuit board according to claim 1, further comprising a support provided on the resin molded section to support the outer electrical component.

* * * * *